United States Patent [19]

Iga et al.

[11] Patent Number: 5,448,195

[45] Date of Patent: Sep. 5, 1995

[54] SEMICONDUCTOR INTEGRATED DELAY CIRCUIT

[75] Inventors: Tetsuya Iga; Koichi Hasegawa, both of Itami, Japan

[73] Assignee: Mitsubishi Denki Kabushiki Kaisha, Tokyo, Japan

[21] Appl. No.: 79,758

[22] Filed: Jun. 22, 1993

[30] Foreign Application Priority Data

Jul. 1, 1992 [JP] Japan .................. 4-174283

[51] Int. Cl.⁶ ............................................. H03K 5/13
[52] U.S. Cl. ..................................... 327/270; 327/281; 327/12; 327/276
[58] Field of Search ............. 307/510, 511, 514, 516, 307/525, 526, 597, 603, 602, 595

[56] References Cited

U.S. PATENT DOCUMENTS

| | | | |
|---|---|---|---|
| 4,122,405 | 10/1978 | Tietz et al. ........................ | 307/511 |
| 4,675,562 | 6/1987 | Herlein et al. .................... | 307/603 |
| 4,845,390 | 7/1989 | Chan ................................. | 307/595 |
| 4,970,507 | 11/1990 | Cooperman et al. ............. | 307/511 |
| 5,118,975 | 6/1992 | Hillis et al. ....................... | 307/603 |

Primary Examiner—Timothy P. Callahan
Assistant Examiner—My-Trang Ton
Attorney, Agent, or Firm—Oblon, Spivak, McClelland, Maier & Neustadt

[57] ABSTRACT

A semiconductor integrated circuit having a plurality of power source voltages in one chip and which comprises delaying means which accurately implements a predetermined delay time into a signal. An inverter circuit block receives at its input part an output from a NAND gate. An output from the inverter circuit block is coupled to a node of a phase comparing part through a switch. The output from the inverter circuit block is also coupled through another switch to an input part of another inverter circuit block whose output is coupled to the node of the phase comparing part through still another switch. A control signal is set at a L level if the phase comparing part is to operate at a first power source voltage and set at a H level if the phase comparing part is to operate at a second power source voltage which is larger than the first power source voltage.

10 Claims, 8 Drawing Sheets

SEMICONDUCTOR INTEGRATED DELAY CIRCUIT

BACKGROUND OF THE INVENTION

1. Field of the Invention

The present invention relates to a semiconductor integrated circuit which comprises a delay circuit which consists of a plurality of series-connected inverters.

2. Description of the Prior Art

FIG. 1 is a circuitry diagram showing a structure of a phase comparison device, i.e., a 1-chip semiconductor integrated circuit which comprises a delay circuit which consists of a plurality of series-connected inverters.

As shown in. FIG. 1, the phase comparison device is comprised of a phase comparison part 30 and an inverter circuit block 40. The inverter circuit block 40 is a delay circuit which consists of a plurality of (even number of) series-connected CMOS inverters (not shown), and connected to both a power source voltage $V_{DD}$ and a ground level. An output signal S3 from a NAND gate G3 is delayed by a time TA in the inverter circuit block 40 and outputted from the same as a delayed signal S3' which will be thereafter transmitted to a node N1 of the phase comparison part 30.

The phase comparison part 30 is formed by nine NAND gates G1 to G9. The NAND gates G1 and G2 are each a three-input NAND gate, the NAND gate G3 is a four-input NAND gate, and the NAND gates G4 to G9 are each a two-input NAND gate. The NAND gates G1 to G9 each have a CMOS structure.

In FIG. 1, indicated at reference character I1 is a reference signal and indicated at reference character I2 is a signal-to-be-controlled. The reference signal I1 is given to the NAND gate G4 as one input thereto. An output from the NAND gate G4 is given to the NAND gates G1 and G3 as a first input thereto and also to the NAND gate G5 as one input thereto. An output from the NAND gate G5 is given to the NAND gates G1 and G3 as a second input thereto and also to the NAND gate G6 as one input. An output from the NAND gate G6 is returned to the NAND gate G5 as the other input thereto.

The signal-to-be-controlled I2 is fed to the NAND gate G9 as one input thereto. An output from the NAND gate G9 is given to the NAND gate G2 as a first input, to the NAND gate G3 as a third input and to the NAND gate G8 as one input. An output from the NAND gate G8 is given to the NAND gate G2 as a second input, to the NAND gate G3 as a fourth input and to the NAND gate G7 as one input. An output from the NAND gate G7 is returned to the NAND gate G8 as the other input thereto.

The output signal S3 from the NAND gate G3 is a signal which is to be transmitted to the inverter circuit block 40. Delayed by a predetermined time in the inverter circuit block 40, the signal S3 is outputted from the inverter circuit block 40 as the delayed signal S3' which is to be given to the node N1. The delayed signal S3' is then routed from the node N1 to the NAND gates G1 and G2 as a third input thereto and to the NAND gates G6 and G7 as the other input thereto.

Signals Q1 and Q2 available at output parts of the NAND gates G1 and G2 are phase compared output signals.

Of the NAND gates G1 to G9 thus connected to each other, the NAND gates G1 and G4 form a first flip-flop, the NAND gates G5 and G6 form a second flip-flop, the NAND gates G2 and G9 form a third flip-flop, and the NAND gates G7 and G8 form a fourth flip-flop.

If the signal-to-be-controlled I2 leads the reference signal I1, the phase compared output signal Q2 from the phase comparison device has an L level pulse whose pulse width is proportional to the phase difference between the signals I1 and I2. If the signal-to-be-controlled I2 lags the reference signal I1, on the other hand, it is the phase compared output signal Q1 from the phase comparison device that has an L level pulse whose pulse width is proportional to the phase difference between the signals I1 and I2.

FIG. 2 is a waveform diagram illustrating phase comparison (FIG. 1) performed by the phase comparison part 30. As shown in FIG. 2, if the signal-to-be-controlled I2 lags the reference signal I1 by a time TG, the phase compared output signal Q1 has an L level pulse of a pulse width (TG+TA) while the phase compared output signal Q2 has an L level pulse of a pulse width TA.

The pulse width TA is a delay time which is implemented by the inverter circuit block 40. The reason for additionally implementing the pulse width TA in the L level pulses of the phase compared output signals Q1 and Q2 of the phase comparison part 30 is to ensure that a next circuit connected to this phase comparison device, such as a charging pump and an integrating circuit, responds quickly and operates normally in response to the phase compared output signals Q1 and Q2. If the pulse width TA is shorter or longer than a predetermined width, the next circuit will not operate precisely as it is desired to do. Hence, the pulse width TA to be implemented by the inverter circuit block 40 must have a fixed constant width.

As hereinabove described, the conventional phase comparison device requires that the inverter circuit block 40 delays the signal S3, which is outputted from the phase comparison part 30, by the delay time TA. As a result, the phase compared output signals Q1 and Q2 as desired are generated.

However, the conventional phase comparison device has a limited success in this regard. If a plurality of power source voltages are used due to specifications regarding a power source of the phase comparison part, the delay time TA implemented by the inverter circuit block 40 changes with different power source voltages.

In other words, the conventional phase comparison device can be used with only one power source voltage, or otherwise, the delay time TA as precisely desired will not be obtainable.

SUMMARY OF THE INVENTION

A semiconductor integrated circuit according to the first aspect of the invention comprises: power source voltage providing means for providing a plurality types of voltage levels; ground level voltage providing means for providing a ground level, the ground level being a fixed voltage; a plurality of signal delaying means for delaying a signal received therein by a predetermined time and outputting a delayed signal, the signal delaying means being each formed of a plurality of series-connected inverters, the plurality of series-connected inverters each defining a H level by the power source voltage and a L level by the ground level; and delaying path synthesizing means for combining input and output parts of more than one of the plurality of signal delaying means in accordance with the voltage level of the power source voltage to thereby synthesize a delaying path through which a signal is always delayed by a predetermined time.

The delaying path synthesizing means preferably includes: a plurality of switching means each interposed between input parts and output parts of a respective one of the plurality of signal delaying means; and delaying path combining means which receives the power source voltage, turns on and off the plurality of switching means in accordance with the voltage level of the power source voltage, and which combines inputs parts and output parts of one or more of the plurality of signal delaying means through the switching means which are in their On-state, whereby a delaying path is created which always delays a signal by a predetermined time.

In an aspect, the semiconductor integrated circuit may be a circuit which comprises: power source voltage providing means for providing a power source voltage of a first voltage level or alternatively a power source voltage of a second voltage level which is higher than the first voltage level; ground level voltage providing means for providing a ground level, the ground level being a fixed voltage; first delaying means having an input part and an output part, the first delaying means being formed of a plurality of series-connected inverters, each of which defining H level by the power source voltage and L level by the ground level, the first delaying means delaying a signal received at the input part thereof by a first delay time in response to the power source voltage of the first voltage level and outputting a delayed signal from the output part thereof, while delaying a signal received at the input part thereof by a second delay time in response to the power source voltage of the second voltage level and outputting a delayed signal from the output part thereof; second delaying means having an input part and an output part, the second delaying means being formed of a plurality of series-connected inverters, each of which defining a H level by the power source voltage and a L level by the ground level, the second delaying means delaying a signal received at the input part thereof by a third delay time in response to the power source voltage of the second voltage level and thereafter outputting a delayed signal from the output part thereof, the third delay time being a difference between the first delay time and the second delay time which is shorter than the first delay time; and delaying path determining means for determining the first delaying means as a signal delaying path when the power source voltage has the first voltage level and for combining the output part of the first delaying means and the input part of the second delaying means and determining a combining path as the signal delaying path of said first and said second delaying means when the power source voltage has the second voltage level.

The delaying path determining means preferably includes: a signal input part which is connected to the input part of the first delaying means; a delayed signal output part, a conductive path from the delayed signal output part to the signal input part being the signal delaying path; first switching means, an input part of the first switching means being connected to the output part of the first delaying means, an output part of the first switching means being connected to the delayed signal output part; second switching means, an input part of the second switching means being connected to the output part of the first delaying means, an output part of the second switching means being connected to the input part of the second delaying means; third switching means, an input part of the third switching means being connected to the output part of the second delaying means, an output part of the third switching means being connected to the delayed signal output part; and switching control means for turning on the first switching means and turning off the second and the third switching means in response to the power source voltage of first second voltage level and for turning off the first switching means and turning on the second and the third switching means in response to the power source voltage of second voltage level.

The semiconductor integrated circuit may further comprise: inner signal outputting means for outputting an inner signal to a signal input part of the signal delaying path; and delayed signal inputting means for inputting a delayed signal from a signal output part of the signal delaying path.

The first to the third switching means may each have a signal control part and turn on and off respectively in response to a first logical level and a second logical level received at its signal control part. The switching control means is preferably responsive to the power source voltage of the first voltage level to give a control signal of the first logical level to the signal control part of the first switching means and to give a control signal of the second logical level to the signal control parts of the second and the third switching means, and responsive to the power source voltage of the second voltage level to give a control signal of the second logical level to the signal control part of the first switching means and to give a control signal of the first logical level to the signal control parts of the second and the third switching means.

The inner signal outputting means and the delayed signal outputting means each may be phase comparing means which receives a first input signal and a second input signal, generates a pulse signal which has a pulse width which corresponds to a phase difference between the first and the second input signals, and which outputs the pulse signal as a first output signal or a second output signal.

The phase comparing means preferably generates a pulse signal which has a pulse width which corresponds to a phase difference between said first and said second input signals and outputs the pulse signal as the first output signal therefrom if the first input signal leads the second input signal and outputs the pulse signal as the second output signal therefrom if the second input signal leads the first input signal.

In a preferred aspect, if the first input signal leads the second input signal, the phase comparing means generates a pulse signal which has a pulse width which is equal to a sum of a phase lead and the first delay time and outputs the pulse signal as the first output signal therefrom, concurrently with which the phase comparing means generates a pulse signal which has a pulse width which is equal to the first delay time and outputs the pulse signal as the second output signal therefrom. If the second input signal leads the first input signal, the phase comparing means generates a pulse signal which has a pulse width which is equal to a sum of a phase lead and the first delay time and outputs the pulse signal as the second output signal therefrom, concurrently with which the phase comparing means generates a pulse signal which has a pulse width which is equal to the first delay time and outputs the pulse signal as the first output signal therefrom.

Thus, in the first aspect of the invention, the delaying path synthesizing means combines input parts and output parts of more than one signal delaying means of a plurality of signal delaying means in accordance with the level of the power source voltage, and thereby forms a synthesized delaying path through which a signal is delayed by a constant delay time. Hence, each signal delaying means generates the same length of a delay time regardless of a change in the level of the power source voltage. As a result, a delay time through the synthesized delaying path is constant. Having such a structure, the semiconductor integrated circuit of the first aspect deals with a plurality of power source specifications in one chip. A signal is accurately delayed by a predetermined delay time.

A semiconductor integrated circuit according to the second aspect of the invention comprises: fixed voltage providing means for providing a fixed voltage of a predetermined voltage level; ground level voltage providing means for providing a ground level voltage, the ground level voltage being a fixed voltage; and signal delaying means for delaying a signal received therein by a predetermined time and outputting a delayed signal, the signal delaying means being formed of a plurality of series-connected inverters, the plurality of series-connected inverters each defining a H level by the fixed voltage and a L level by the ground level voltage.

The fixed voltage providing means is preferably a constant voltage circuit which receives a power source voltage and the ground level voltage and which outputs the fixed voltage.

Thus, in the second aspect of the invention, the signal delaying means is each comprised of a plurality of series-connected inverters. The inverters stay at a H level responsive to the fixed voltage provided from the fixed voltage providing means and at a L level responsive to the ground level. The signal delaying means delays an input signal by a predetermined time and outputs the same. Structured as described immediately above, the signal delaying means ensures that the voltages which switch the level of the inverters between H and L levels are always fixed even when the power source voltage for the semiconductor integrated circuit is changed.

Accordingly, it is an object of the present invention to offer a semiconductor integrated circuit in which a plurality of power source voltages are dealt with in one chip and which comprises delaying means which accurately implements a predetermined delay time into a signal.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
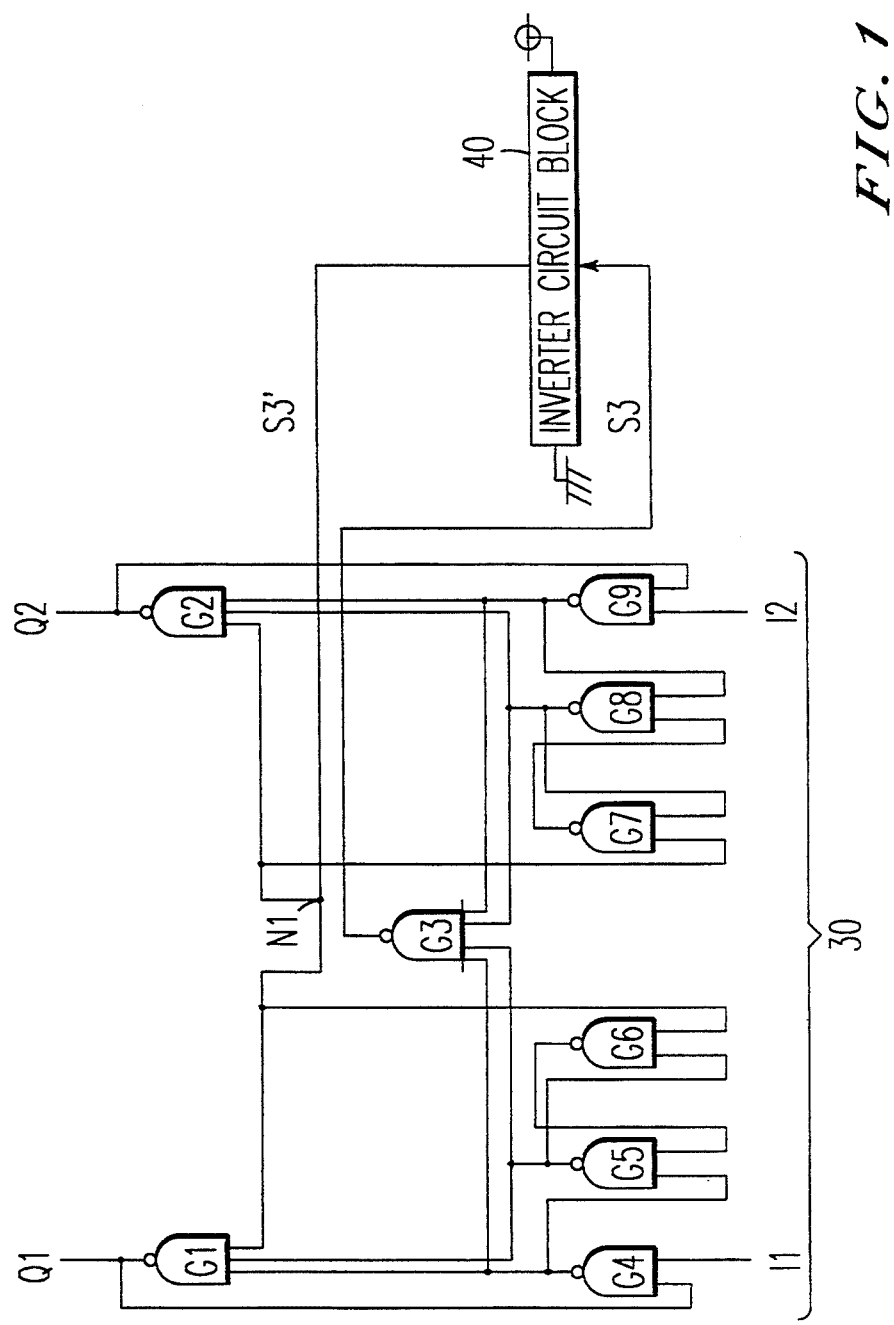
FIG. 1 is a circuitry diagram showing a structure of a conventional phase comparing device.
Figure 2:
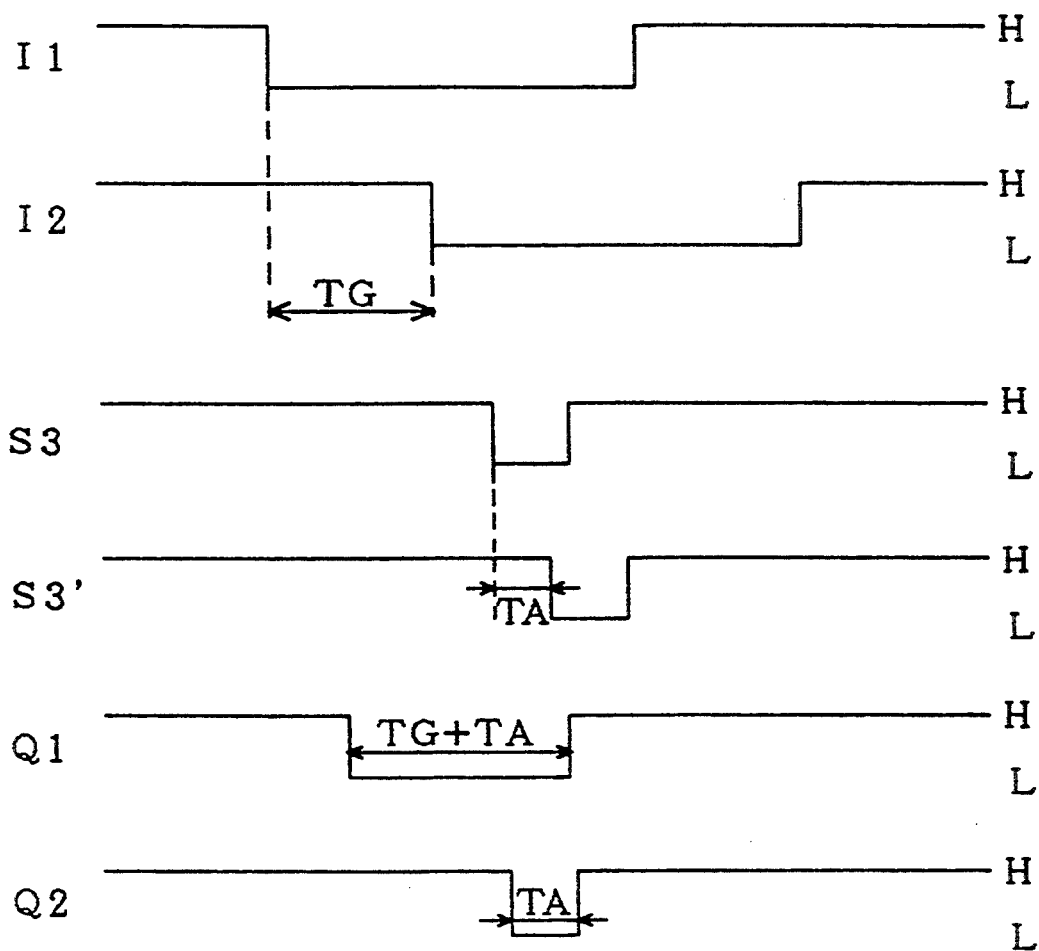
FIG. 2 is a waveform diagram showing operations of the conventional phase comparing device.
Figure 3:
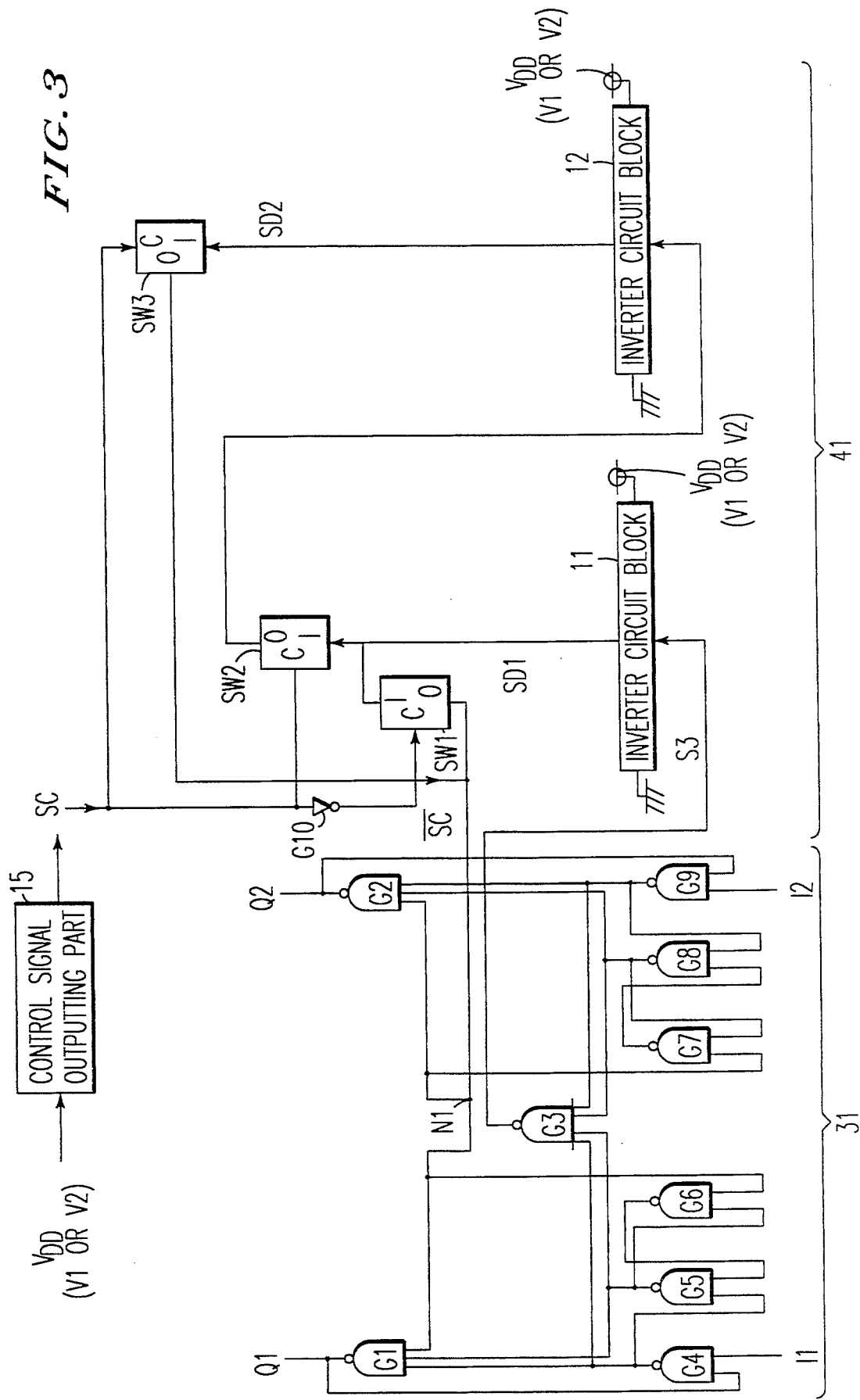
FIG. 3 is a circuitry diagram showing a structure of a phase comparison device according to a first preferred embodiment of the present invention.

FIG. 3 is a circuitry diagram showing a structure of a 1-chip phase comparison device according to a first preferred embodiment of the present invention. As shown in FIG. 3, the phase comparison device of the first preferred embodiment is comprised of a phase comparison part 31 as an inner signal outputting means and a signal delaying part 41. Since the phase comparison part 31 is similar in structure to the corresponding phase comparison part 30 of the conventional phase comparison device of FIG. 7, the structure of the phase comparison part 31 will be not be described here.

The phase comparison device of the first preferred embodiment is adaptive to two different power source voltages $V_{DD}$, namely, power source voltages V1 and V2 (V2>V1).

The signal delaying part 41 consists of two inverter circuit blocks 11 and 12, three switches SW1 to SW3 and an inverter G10.

Figure 4:
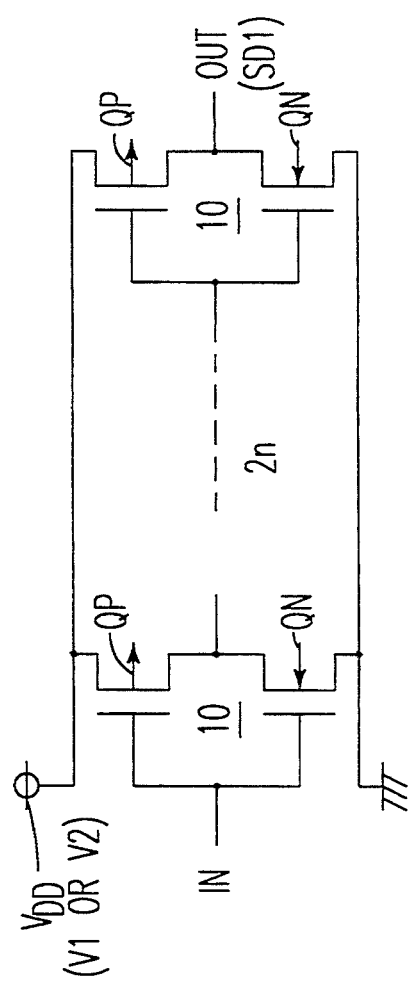
FIG. 4 is a circuitry diagram showing an inner structure of an inverter circuit block which is used in the first preferred embodiment of the present invention.

FIG. 4 is a circuitry diagram showing an inner structure of the inverter circuit block 11. As shown in FIG. 4, the inverter circuit block 11 is formed by 2n series-connected CMOS inverters 10 where n is an integer equal to or larger than 1. In each CMOS inverter 10, a PMOS transistor QP has a source which is connected to the power source voltage $V_{DD}$, and an NMOS transistor QN has a grounded source. Drains of the PMOS and the NMOS transistors QP and QN are connected to each other. Gates of the PMOS and the NMOS transistors QP and QN of the inverters are connected in common. Hence, a signal received at the gates of the PMOS and the NMOS transistors QP and QN is an input signal to the CMOS inverter 10, and a signal obtainable at the drains of the PMOS and the NMOS transistors QP and QN is an output signal which is available from the CMOS inverter 10.

Having such a structure, the inverter circuit block 11 receives an input signal IN at an input part of a first inverter 10 and delays the input signal IN by a delay time $\Delta T1$, i.e., a propagation time of the signal IN through the 2n inverters 10. The signal is then outputted from an output part of the last inverters 10 as an output signal OUT(SD1).

The inverters circuit block 11 is also designed such that the delay time $\Delta T1$ (V1) it is to implement when the power source voltage $V_{DD}$ is V1 is equal to a normal delay time $\Delta TN$. Hence, a delay time $\Delta T1$ (V2) of when the power source voltage $V_{DD}$ is the voltage V2 (>V1) is shorter than the normal delay time $\Delta TN$.

Although not illustrated, the inverter circuit block 12 is formed by 2m inverters which are connected in series where m is an integer equal to or larger than 1, which is generally similar to the inverter circuit block 11. The inverter circuit block 12 delays an input signal received therein by a delay time ΔT2 which is equal to a time required for the input signal to advance through the 2m inverter. The signal as thus delayed is then outputted from the inverter circuit block 12 as an output signal.

The inverter circuit block 12 is designed such that the delay time ΔT2 (V2) it is to implement when the power source voltage $V_{DD}$ is V2 satisfies Eq. 1 below.

$$\Delta T2(V2) = \Delta TN - \Delta T1(V2) \qquad (I)$$

The switches SW1 to SW3 each have a signal input part I, a signal output part O and a signal control part C. Each switch turns on in response to an H level signal received at the signal control part C to allow that a signal passed from the signal input part I is outputted outside at the signal output part O. If a signal from the signal control parts C has a L level, the switches turn off and block a signal which is received at their signal input parts I, whereby no signal is outputted from the signal output parts O of the switches.

The inverter circuit block 11 receives the signal S3 from the NAND gate G3 and outputs the output signal SD1 to the signal input parts I of the switches SW1 and SW2. The switch SW1 is regulated by a control signal $\overline{SC}$ which is received therein at the signal control part C. The control signal $\overline{SC}$ is obtainable by inverting in the inverter G10 a control signal SC which is loaded from outside. The signal output part O of the switch SW1 is connected to the node N1 of the phase comparison part 31. On the other hand, the switch SW2 is governed by the control signal SC which is received at its signal control part C. The signal output part O of the switch SW2 is connected to the input part of the inverter circuit block 12.

The output signal SD2 from the inverter circuit block 12 is fed to the signal input part I of the switch SW3. The switch SW3 receives the control signal SC at its signal control part C. The signal output part O of the switch SW3 is connected to the node N1 of the phase comparison part 31.

A control signal outputting part 15 receives a power source voltage $V_{DD}$ and outputs a control signal SC which becomes a L level when the power source voltage $V_{DD}$ is the power source voltage V1 and the phase comparison device is operated at the power source voltage V1, and becomes a H level when the power source voltage $V_{DD}$ is the second power source voltage V2 (V2>V1) and the phase comparison device is operated at the power source voltage V2.

In the signal delaying part 41 which has the structure above, the signal S3 from the NAND gate G3 of the phase comparison part 31 is fed to the inverter circuit block 11 as an input thereto and delayed therein by the normal delay time ΔTN. Of the delayed signals obtainable at the switches SW1 to SW3, the one to be outputted to the node N1 of the phase comparison part 31 is the delayed signal that is available at the signal output part O of one of the switches SW1 to SW3 which is selected responsive to the control signal SC (or control signal $\overline{SC}$.

In the following, description will be given on a delay time ΔS3 which the signal delaying part 41 implements into the output signal S3 of the NAND gate G3.

When the first power source voltage V1 is used as the power source voltage $V_{DD}$ for the phase comparison device, the control signal SC of a L level is fed to the signal delaying part 41. In response to this, the control signal $\overline{SC}$ is derived and given to the signal control part C of the switch SW1, thereby turning on the switch SW1. At the same time, the control signal SC is supplied to the signal control parts C of the switches SW2 and SW3, which turn off the switches SW2 and SW3.

As a result, what is available at the node N1 is a signal which is outputted from the signal output part O of the switch SW1, i.e., the output signal SD1 of the inverter circuit block 11. Hence, when the first power source voltage is used, the output signal S3 is delayed by the delay time ΔS3 (V1):

$$\Delta S3(V1) = \Delta T1(V1) = \Delta TN \qquad (II)$$

On the other hand, when the second power source voltage V2 (>V1) is used as the power source voltage $V_{DD}$ for the phase comparison device, the control signal SC of H level is fed to the signal delaying part 41. This causes the switch SW1 to turn off which receives the control signal $\overline{SC}$ at its signal control part C, and the switches SW2 and SW3 to turn on which receive the control signal SC at their signal control parts C.

Hence, a signal obtainable at the node N1 is what is available at the signal output part O of the switch SW3, i.e., the output signal SD2 of the inverter circuit block 12. Since the output signal SD2 is equal to the signal S3 as inverted by the inverter circuit block 11, the switch SW2 and the inverter circuit block 12, the delay time ΔS3 (V2) of the output signal S3 of when the second power source voltage V2 is used is:

$$\Delta S3(V2) = \Delta T1(V2) + \Delta T2(V2) \qquad (III)$$

When the power source voltage V2 is used, the delay times ΔT1 (V2) and ΔT2 (V2) respectively implemented by the inverter circuit blocks 11 and 12 satisfy Eq. 1. Therefore, $$\Delta S3(V2) = \Delta TN \qquad (IV)$$

Thus, the phase comparison device of the first preferred embodiment ensures that the delay time ΔS3, a delay the signal S3 acquires through the signal delaying part 41 until appearing at the node N1, is fixed at the normal delay time ΔTN regardless of whether the power source voltage $V_{DD}$ is V1 or V2.

Figure 5:
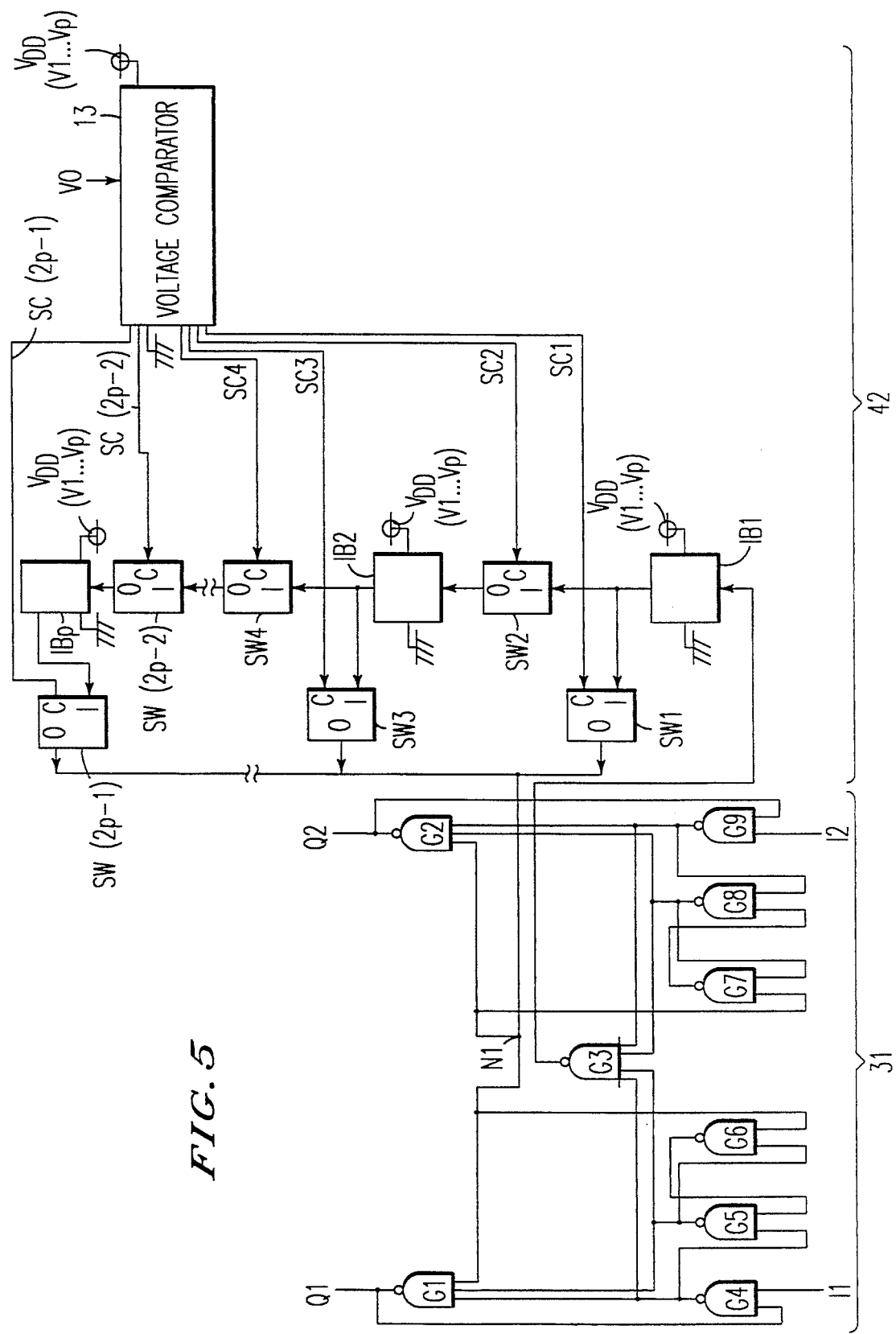
FIG. 5 is a circuitry diagram showing a structure of a phase comparison device according to a second preferred embodiment of the present invention.

FIG. 5 is a circuitry diagram showing a structure of a 1-chip phase comparison device according to a second preferred embodiment of the present invention. As shown in FIG. 5, the phase comparison device of the second preferred embodiment is comprised of a phase comparison part 31 and a signal delaying part 42.

The phase comparison device of the second preferred embodiment is adaptive to p types of power source voltages V1, V2 ... Vp (V1<V2<... <Vp).

The signal delaying part 42 consists of a voltage comparator 13, p inverter blocks IB1 to IBp and (2p−1) switches SW1 to SW(2p−1) where p is an integer equal to or larger than 3.

Similarly to the inverter circuit blocks of the first preferred embodiment (See FIG. 4), the inverter blocks IB1 to IBp are each formed by connecting a plurality of CMOS inverters in series.

The inverter circuit block IB1 receives at its input part the output signal S3 of the NAND gate G3 of the phase comparison part 31. An output from the inverter circuit block IB1 is coupled to the input parts I of the switches SW1 and SW2. The signal output part O of the switch SW1 is connected to the node N1 of the phase comparison part 31. The signal output part O of the switch SW2 is connected to the input part of the next inverter circuit block IB2.

An output from the inverter circuit block IB2 is coupled to the signal input parts I of the switches SW3 and SW4. The signal output part O of the switch SW3 is connected to the node NI of the phase comparison part 31. The signal output part O of the switch SW4 is connected to the input part of the next inverter circuit block IB3 (not shown).

In a similar fashion, an output from an inverter circuit block IBk is coupled to the signal input parts I of the switches SW(2k−1) and SW(2k) (where k is an integer between 3 and (p−1)). The signal output part O of the switch SW(2k−1) is connected to the node N1 of the phase comparison part 31. The signal output part O of the switch SW(2k) is connected to the input part of the next inverter circuit block IB(k+1).

An output from the inverter circuit block IBp is coupled to the input part of the switch SW(2p−1), and the signal output part O of the switch SW(2p−1) is connected to the node N1 of the phase comparison part 31. The switches SW1 to SW(2p−1) are similar in inner structure to the switches SW1 to SW3 of the first preferred embodiment.

The voltage comparator 13 receives the power source voltage $V_{DD}$ which drives the phase comparison device, the ground level and an external power source voltage VO, and gives control signals SC1 to SC(2p−1) to the signal control parts C of the switches SW1 to SW(2p−1), respectively.

Figure 6:
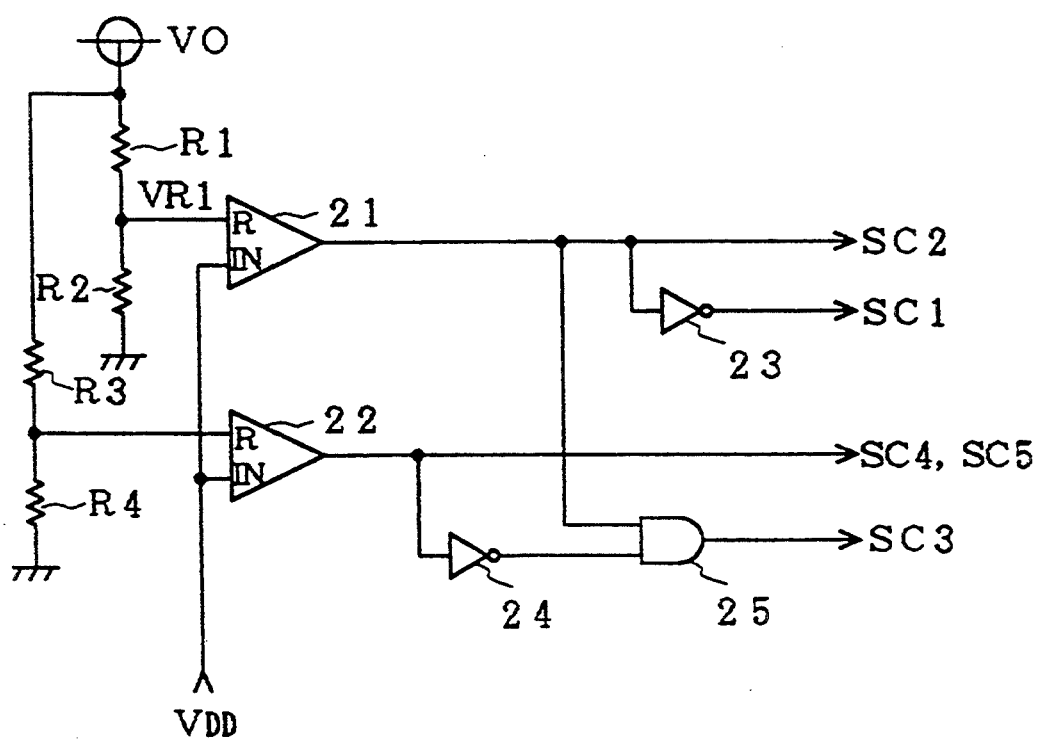
FIG. 6 is a circuitry diagram showing a structure of a voltage comparator which is used in the first preferred embodiment of the present invention.
Figure 7:
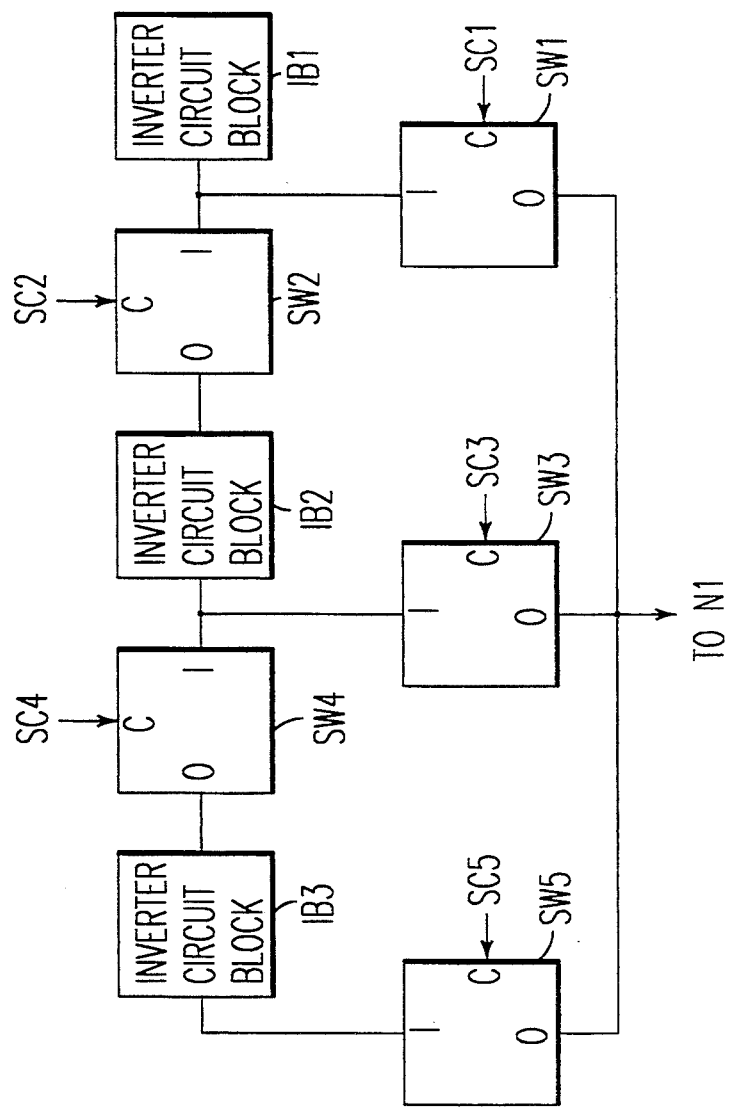
FIG. 7 is a circuitry diagram showing a structure of a signal delaying part which is used in the first preferred embodiment of the present invention.

FIG. 6 is a circuitry diagram showing a structure of the voltage comparator 13. The voltage comparator 13 of FIG. 6 is tailored to deal with where the signal delaying part 42 is comprised of the inverter circuit blocks IB1 to IB3 and the switches SW1 to SW5 (where p=3) and to be adaptive to three different power source voltages V1 to V3 (FIG. 7).

As shown in FIG. 6, the voltage comparator consists of two comparators 21 and 22, four resistors R1 to R4, two inverters 23 and 24, and an AND gate 25.

Comprising a reference input terminal R and a comparison input terminal IN, the comparators 21 and 22 compare a voltage VR available from the reference input terminal with a voltage VIN available from the comparison input terminal IN. If the voltage VR is larger than the voltage VIN, an L level signal is outputted from the comparators 21 and 22. If the voltage VR is smaller than the voltage VIN, a signal from the comparators 21 and 22 has a H level.

The comparator 21 receives at its reference input terminal R a first comparison voltage VR1 which is obtainable by dividing the external power source voltage VO at the resistors R1 and R2. A voltage which is coupled to the comparison input terminal IN of the comparator 21 is the power source voltage $V_{DD}$ which activates the phase comparison device. On the other hand, the comparator 22 receives at its reference input terminal R a second comparison voltage VR2 which is obtainable by dividing the external power source voltage VO at the resistors R3 and R4. A voltage which is coupled to the comparison input terminal IN of the comparator 21 is the power source voltage $V_{DD}$. The resistances of the resistors R1 to R4 are set such that the first and the second comparison voltages VR1 and VR2 satisfy the relation VR1<VR2, and the relation V1<VR1<V2<VR2<V3 when compared with the three power source voltages V1 to V3.

An output from the comparator 21 as it is outputted as a second control signal SC2. At the same time, the output from the comparator 21 is also given to the inverter 23 as an input thereto and to the AND gate 25 as one input thereto. An output from the comparator 22 is outputted as a fourth control signal SC4 and a fifth control signal SC5. The output from the comparator 22 is also fed to the inverter 24. An output from the inverter 23 is outputted as the control signal SC1. An output from the inverter 24 is fed to the AND gate 25 as the other input thereto. An output signal from the AND gate 25 is outputted as a control signal SC3.

In the voltage comparator structured as above, outputs from the comparators 21 and 22 have a L level when the power source voltage $V_{DD}$ is V1 (<VR1). Hence, the control signal SC1 has a L level and the other control signals SC2 to SC5 equally have a L level, which turns on the switch SW1 and turns off the switches SW2 to SW5.

When the power source voltage $V_{DD}$ is V2 (VR1>V2>VR2), an output from the comparator 21 has H level while an output from the comparator 22 has L level. This causes that the control signals SC1, SC2, SC3, SC4 and SC5 have L, H, H, L, L level, respectively, thereby turning on the switches SW2 and SW3 and turning off the remaining switches SW1, SW4 and SW5.

If the power source voltage $V_{DD}$ is V3 (>VR2), output signals from both the comparators 21 and 22 have H level. In response to this, the control signals SC1, SC2, SC3, SC4 and SC5 have L, H, L, H, H level, respectively. As a result, the switches SW2, SW4 and SW5 turn on and the switches SW1 and SW3 turn off.

Thus, the voltage comparator 13 receives the power source voltage $V_{DD}$ and the external power source voltage VO. In accordance with which one of the voltages V1 to Vp is used as the power source voltage $V_{DD}$, the voltage comparator 13 then sets the control signals SC1, SC3, . . . SC(2p−1) at a L level except for the control signal SCq which is set at a H level by the voltage comparator 13 (where q is an odd integer equal to or smaller than 2p). At the same time, the voltage comparator 13 sets, of the control signals SC2, SC4, . . . SC(2p−2), all the control signals which are numbered with a subscript smaller than q at a H level, and all the control signals which are indicated with a subscript larger than q at a L level.

In short, the voltage comparator 13 sets the control signal SC(2i−1) at H level, the control signals SC2, SC4, . . , SC(2i−2) at H level and the other control signals at a L level in response to the power source voltage Vi where i is an integer between 1 and p.

The delay time ΔT1 (V1), which is implemented by the inverter circuit block IB1 when the power source voltage $V_{DD}$ is V1, is set at the normal delay time ΔTN introduced into the output signal S3, the signal that is to be outputted from the NAND gate G3.

Then, the delay time ΔT2 (V2) the inverter circuit block IB2 generates when the power source voltage $V_{DD}$ is V2 is set so that:

$$\Delta T2(V2) = \Delta TN - \Delta T1(V2) \qquad (V)$$

In a similar manner, the delay time ΔTj (Vj) implemented by the inverter circuit block IBj when the power source voltage $V_{DD}$ is Vj is set so that (where j is an integer which satisfies p≧j≧3):

$$\Delta Tj(Vj) = \Delta TN - \Delta T(j-1)(Vj) - \Delta T(j-2)(Vj) \quad \text{(VI)}$$
$$\ldots - \Delta T2(Vj) - \Delta T1(Vj)$$

Having such a structure, the signal delaying part 42 receives the signal S3, which is outputted from the NAND gate G3 of the phase comparison part 31, at the input part of the inverter circuit block IB1, and delays the signal by the normal delay time ΔTN. The signal delaying part 42 then outputs the delayed signal to the node N1 from the signal output part of one of the switches SW1, SW3, ... SW(2p−1) which is made effective in response to the control signals SC1, SC3, ... SC(2p−1).

Now, a description will be made about the delay time ΔS3 introduced by the signal delaying part 42 into the signal S3 of the NAND gate G3.

When the phase comparison device is to operate at the power source voltage V1, the voltage comparator 13 sets the control signal SC1 at a H level and the other control signals SC2 to SC(2p−1) at a L level, turns on the switch SW1 and turn off the other switches SW2 to SW(2p−1).

As a result, a signal from the output part O of the switch SW1 is allowed to the node N1; in other words, the output signal from the inverter circuit block IB1 is given to the node N1. Hence, when the power source voltage $V_{DD}$ is V1, the delay time ΔS3 (V1) of the output signal S3 is:

$$\Delta S3(V1) = \Delta T1(V1) = \Delta TN \quad \text{(VII)}$$

On the other hand, if the phase comparison device is to operate at the power source voltage V2 (>V1), the voltage comparator 13 sets the control signals SC3 and SC2 at a H level and the control signals SC1, SC4 ... SC(2p−1) at a L level, turns on the switches SW3 and SW2 and turn off the other switches SW1, SW4 ... SW(2p−1).

This causes a signal from the output part O of the switch SW3, i.e., output signal from the inverter circuit block IB2 to be allowed to the node N1. Since this signal which thus appears at the node N1 is what is obtainable by processing the signal S3 from the NAND gate G3 in the inverter circuit block IB1, the switch SW2 and the inverter circuit block IB2, the delay time ΔS3 (V2) included in the output signal S3 of when the power source voltage $V_{DD}$ (i) is V2 is:

$$\Delta S3(V2) = \Delta T1(V2) + \Delta T2(V2) \quad \text{(VIII)}$$

When the power source voltage V2 is used, the delay times ΔT1 (V2) and ΔT2 (V2) implemented respectively by the inverter circuit blocks IB1 and IB2 satisfy Eq. V. Hence, $$\Delta S3(V2) = \Delta TN \quad \text{(IX)}$$

This is summarized as follows. When the power source voltage $V_{DD}$ is Vj (where j is an integer satisfying p≧j≧3), the control signal SC(2j−1), the control signals SC2, SC4 ... SC(2j−2) are set at a H level and the other control signals are set at a L level. In addition, the switches SW(2j−1), SW2, SW4 ... SW(2j−2) are turned on and the remaining switches are turned off.

As a result, a signal from the output part O of the switch SW(2j−1) is allowed to the node N1; that is, the output signal from the inverter circuit block IBj is routed to the node N1. This signal which is available at the node N1 is what is obtainable by processing the signal S3 of the NAND gate G3 in the inverter circuit block IB1, the switch SW2, the inverter circuit block IB2, the switches SW4, ..., SW(2j−2), and the inverter circuit block IBj. Hence, the delay time ΔS3 (Vj) included in the output signal S3 of when the power source voltage $V_{DD}$ is Vj is:

$$\Delta S3(Vj) = \Delta T1(Vj) + \Delta T2(Vj) \quad \text{(X)}$$
$$\ldots + \Delta T(j-1)(Vj) + \Delta Tj(Vj)$$

Since the delay times ΔT1(Vj) to ΔTj (Vj) introduced by the inverter circuit blocks IB1 to IBj satisfy Eq. VI when the power source voltage Vj is used, $$\Delta S3(Vj) = \Delta TN \quad \text{(XI)}$$

Thus, the phase comparison device of the second preferred embodiment ensures that the delay time ΔS3, a delay time the signal delaying part 42 introduces into the signal S3 until the signal S3 appears at the node N1, is fixed at the normal delay time ΔTN regardless of whether the power source voltage $V_{DD}$ is any one of V1 to Vp.

Figure 8:
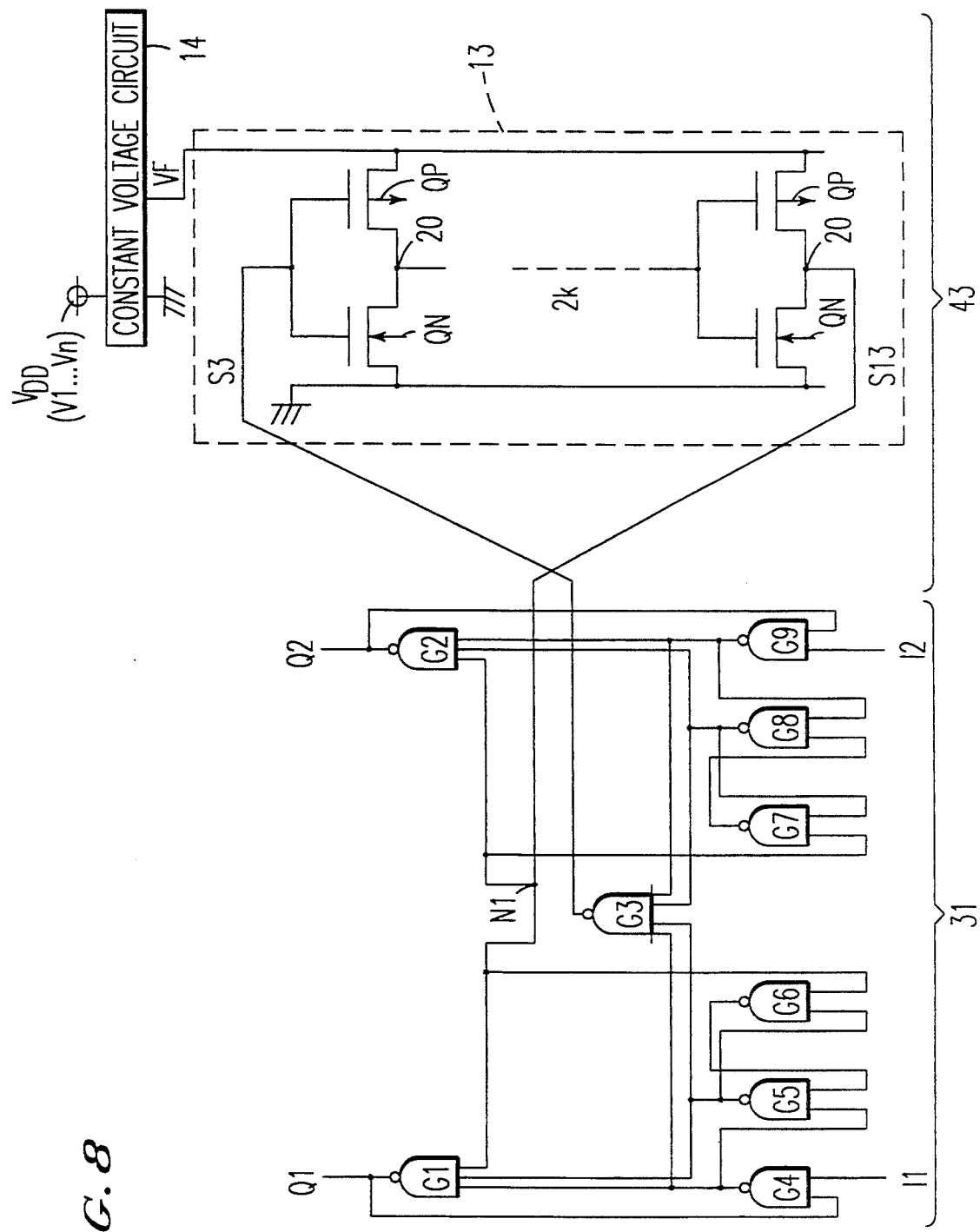
FIG. 8 is a circuitry diagram showing a structure of a phase comparison device according to a third preferred embodiment of the present invention.

FIG. 8 is a circuitry diagram showing a structure of a 1-chip phase comparison device according to a third preferred embodiment of the present invention. As shown in FIG. 8, the phase comparison device of the third preferred embodiment is comprised of a phase comparison part 31 and a signal delaying part 43.

The phase comparison part 31 of the third preferred embodiment has the same structure as that of the first preferred embodiment. Hence, similar description will be simply omitted. On the other hand, the signal delaying part 43 is formed by a constant voltage circuit 14 and an inverter circuit block 13.

The constant voltage circuit 14 is connected to the power source voltage $V_{DD}$ and the ground level and outputs a fixed voltage VF. The constant voltage circuit 14 is designed such that the fixed voltage VF therefrom always stays at a constant level even if the power source voltage $V_{DD}$ changes.

The inverter circuit block 13 consists of 2k series-connected CMOS inverters 20. In each CMOS inverter 20, a PMOS transistor QP has a source which is connected to the fixed voltage VF, and an NMOS transistor QN has a source which is grounded. Drains of the PMOS and the NMOS transistors QP and QN are connected to each other. Gates of the PMOS and the NMOS transistors QP and QN of the inverters 20 arc connected in common. Hence, a signal received at the gates of the PMOS and the NMOS transistors QP and QN of each CMOS inverter 20 is an input signal to the CMOS inverter 20, and a signal obtainable at the drains of the PMOS and the NMOS transistors QP and QN of each CMOS inverter 20 is an output signal which is to be outputted from the CMOS inverter 20.

The signal S3 obtainable from the NAND gate G3 is inputted to the input part of the first CMOS inverter 20. The signal S3 is then delayed by a delay time ΔT13 on its way through the 2k inverters 20. The delayed signal is outputted to the node N1 from the output part of the last CMOS inverter 20 as a delayed signal S13. The delay time ΔT13 is set to be equal to the normal delay time ΔTN.

Thus, in the phase comparison device of the third preferred embodiment, the inverter circuit block 13 is set at a H level by the fixed voltage VF and at a L level by the ground level. Hence, even if the power source voltage $V_{DD}$ changes among a plurality of voltage levels, the voltages which govern the level (H or L) of the inverter circuit block 13 do not change, which in turn enables that the delay time $\Delta T13$ implemented by the inverter circuit block 13 is always the same as the normal delay time $\Delta TN$.

Although the first to the third preferred embodiments heretofore described relate to a phase comparison device, other applications of the present invention relate to semiconductor integrated circuits which delays an inner signal as accurately as desired in response to a plurality of power source voltages.

While the invention has been described in detail, the foregoing description is in all aspects illustrative and not restrictive. It is understood that numerous other modifications and variations can be devised without departing from the scope of the invention.

We claim:

1. A semiconductor integrated circuit to which a plurality of voltage levels of power source voltage are applied, comprising:

ground level voltage providing means for providing a ground level, said ground level being a fixed voltage;

a plurality of signal delaying means operably connected to said power source voltage for delaying a signal received therein by a predetermined time and outputting a delayed signal, said signal delaying means comprising a plurality of series-connected inverters, said plurality of series-connected inverters each defining a H level by said power source voltage and a L level by said ground level; and controllable delaying path synthesizing means operably connected to said plurality of signal delaying means for selectively combining input and output parts of at least one of said plurality of signal delaying means in accordance with a control signal responsive to a corresponding voltage level of said plurality of voltage levels of said power source voltage to thereby synthesize a delaying path through which a signal is always delayed by a fixed predetermined time.

2. The semiconductor integrated circuit of claim 1, wherein said controllable delaying path synthesizing means includes:

a plurality of switching means each interposed between input parts and output parts of a respective one of said plurality of signal delaying means; and delaying path combining means which receives said power source voltage, turns on and off said plurality of switching means in accordance with the voltage level of said power source voltage, and which combines input parts and output parts of one or more of said plurality of signal delaying means through said switching means which are in their On-state, whereby a delaying path is created which always delays a signal by a fixed predetermined time.

3. A semiconductor integrated circuit, comprising:

power source voltage providing means for providing a power source voltage of a first voltage level or alternately a power source voltage of a second voltage level which is higher than said first voltage level;

ground level voltage providing means for providing a ground level, said ground level being a fixed voltage;

first delaying means having an input part and an output part, said first delaying means comprising a plurality of series-connected inverters, each of which defining a H level by said power source voltage and a L level by said ground level, said first delaying means delaying a signal received at the input part thereof by a first delay time in response to said power source voltage of said first voltage level and outputting a delayed signal from the output part thereof, while delaying a signal received at the input part thereof by a second delay time in response to said power source voltage of said second voltage level and outputting a delayed signal from the output part thereof;

second delaying means having an input part and an output part, said second delaying means comprising a plurality of series-connected inverters each of which defining a H level by said power source voltage and a L level by said ground level, said second delaying means delaying a signal received at the input part thereof by a third delay time in response to said power source voltage of said second voltage level and thereafter outputting a delayed signal from the output part thereof, said third delay time being a difference between said first delay time and said second delay time which is shorter than said first delay time; and delaying path determining means for determining said first delaying means as a signal delaying path when said power source voltage has said first voltage level and for combining said output part of said first delaying means and said input part of said second delaying means and determining a combining path of said first and said second delaying means as said signal delaying path when said power source voltage has said second voltage level to provide a fixed predetermined signal delay time.

4. A semiconductor integrated circuit to which a power source voltage of either a first voltage level or a second voltage level which is higher than said first voltage level is applied, comprising:

a delayed signal output part, a conductive path from said delayed signal output part to a signal input part being a signal delaying path;

first switching means, an input part of said first switching means being connected to an output part of a first delaying means, an output part of said first switching means being connected to said delayed signal output part;

second switching means, an input part of said second switching means being connected to said output part of said first delaying means, an output part of said second switching means being connected to an input of a second delaying means;

third switching means, an input part of said third switching means being connected to an output part of said second delaying means, an output part of said third switching means being connected to said delayed signal output part; and switching control means for turning on said first switching means and turning off said second and said third switching means in response to said power source voltage of said first voltage level and for turning off said first switching means and turning on said second and said third switching means in response to said power source voltage of said second voltage level.

5. The semiconductor integrated circuit of claim 4, wherein said first to said third switching means each have a signal control part and turn on and off respectively in response to a first logical level and a second logical level received at its signal control part,
and wherein said switching control means is:
responsive to said power source voltage of said first voltage level to give a control signal of said first logical level to said signal control part of said first switching means and to give a control signal of said second logical level to said signal control parts of said second and said third switching means; and
responsive to said power source voltage of said second voltage level to give a control signal of said second logical level to said signal control part of said first switching means and to give a control signal of said first logical level to said signal control parts of said second and said third switching means.

6. The semiconductor integrated circuit of claim 5, further comprising:
phase comparison means for receiving a first input signal and a second input signal and outputting a pulse signal, which has a pulse width corresponding to a phase difference between the first input signal and the second input signal, as either a first output signal or a second output signal, said phase comparison means outputting an inner signal to a signal input part of said signal delaying path, and inputting a delay signal outputted from a signal output part of said signal delaying path as an inner signal.

7. The semiconductor integrated circuit of claim 6, wherein said phase comparison means generates a pulse signal which has a pulse width which corresponds to a phase difference between said first input signal and said second input signal and outputs said pulse signal as said first output signal therefrom if said first input signal leads said second input signal and outputs said pulse signal as said second output signal therefrom if said second input signal leads said first input signal.

8. The semiconductor integrated circuit of claim 7, wherein if said first input signal leads said second input signal, said phase comparison means generates a pulse signal which has a pulse width which is equal to a sum of a phase lead and a first delay time and outputs the pulse signal as said first output signal therefrom, concurrently with which said phase comparison means generates a pulse signal which has a pulse width which is equal to said first delay time and outputs the pulse signal as said second output signal therefrom, and wherein if said second input signal leads said first input signal, said phase comparison means generates a pulse signal which has a pulse width which is equal to a sum of a phase lead and said first delay time and outputs the pulse signal as said second output signal therefrom, concurrently with which said phase comparison means generates a pulse signal which has a pulse width which is equal to said first delay time and outputs the pulse signal as said first output signal therefrom.

9. A semiconductor integrated circuit, comprising:
fixed voltage providing means for providing a fixed voltage of a predetermined voltage level which is independent from the influence of a variation in the power source voltage;
ground level voltage providing means for providing a ground level voltage; and
signal delaying means for delaying a signal received therein by a fixed predetermined time and outputting a delayed signal, said signal delaying means comprising a plurality of series-connected inverters, said plurality of series-connected inverters each defining a H level by said fixed voltage and a L level by said ground level voltage.

10. The semiconductor integrated circuit of claim 9, wherein said fixed voltage providing means comprises a constant voltage circuit which receives a power source voltage and said ground level voltage and which outputs a fixed voltage of a predetermined voltage level.

* * * * *